(12) United States Patent
Sharma (10) Patent No.: US 7,596,731 B1
(45) Date of Patent: Sep. 29, 2009

(54) TEST TIME REDUCTION ALGORITHM

(75) Inventor: Monika Sharma, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 216 days.

(21) Appl. No.: 11/655,368

(22) Filed: Jan. 19, 2007

Related U.S. Application Data (60) Provisional application No. 60/790,444, filed on Apr. 7, 2006.

(51) Int. Cl.
  *G06F 11/00* (2006.01)
  *G01R 31/28* (2006.01)
  *G01R 31/26* (2006.01)

(52) U.S. Cl. ............... 714/724; 714/25; 714/32; 714/733; 714/738; 714/742; 324/765

(58) Field of Classification Search .......... 714/25, 714/32, 724, 733, 738, 742; 324/765
  See application file for complete search history.

(56) References Cited

U.S. PATENT DOCUMENTS

| | | | |
|---|---|---|---|
| 5,771,243 A * | 6/1998 | Lee et al. | 714/738 |
| 5,996,101 A * | 11/1999 | Masumoto | 714/738 |
| 6,883,150 B2 * | 4/2005 | Soltis et al. | 716/4 |
| 6,907,378 B2 * | 6/2005 | Stirrat et al. | 702/119 |
| 6,941,497 B2 * | 9/2005 | Wu et al. | 714/724 |
| 7,139,676 B2 * | 11/2006 | Barford | 702/183 |
| 7,474,979 B1 * | 1/2009 | Stevens et al. | 702/119 |

FOREIGN PATENT DOCUMENTS

GB  EP001403651 A2 * 3/2004

OTHER PUBLICATIONS

Wu et al., Methods for Memory Test Time Reduction, 1996, IEEE, pp. 64-70.*
Yeh et al., A Systematic Approach to Reducing Semiconductor Memory Test Time in Mass Production, 2005, pp. 1-6.*

* cited by examiner

*Primary Examiner*—John J Tabone, Jr.

(57) ABSTRACT

Exemplary embodiments provide a method and system for reducing test time for electronic devices. The method and system aspects include receiving a test data file containing results from a set of tests run on a first set of devices; determining a frequency of failure metric for each of the tests from the test data file; classifying each one of the tests as redundant or necessary based on the frequency of failure metric determined for each of the tests; and creating a reduced set of tests that includes the necessary test but does not include the redundant tests.

39 Claims, 9 Drawing Sheets

| Device | Count | BIN 166 | BIN 168 | BIN 170 | BIN 171 | BIN 172 | BIN 173 | BIN 174 | BIN 175 | BIN 176 | BIN 183 | BIN 184 | BIN 203 | BIN 204 | BIN 208 | BIN 227 | BIN 228 | BIN 229 |
|---|---|---|---|---|---|---|---|---|---|---|---|---|---|---|---|---|---|---|
| 1 | 44 | | | | | | | | | | | | | | | | | |
| 2 | 2 | | | | 1 | | | | 1 | | | | | | | | | |
| 3 | 1 | | | | 1 | | | | | | | | | | | | | |
| 4 | 10 | | 1 | 1 | | 1 | 1 | | | 1 | | 1 | | 1 | 1 | | 1 | |
| 5 | 2 | | | | | | | 1 | | | | | | | | | | |
| 6 | 2 | | | 1 | | | | | | 1 | 1 | | | | | | | |
| 7 | 2 | | | | | | | | | | | | | | | 1 | | 1 |
| 8 | 1 | | | | | | | | | | | | | | | 1 | 1 | 1 |
| 9 | 3 | 1 | 1 | | | | | | | | | | | | | | 1 | |
| bin count --> | | 1 | 1 | 2 | 2 | 1 | 2 | 1 | 2 | 2 | 1 | 1 | 1 | 1 | 1 | 2 | 3 | 2 |
| test time (ms) --> | | 400 | 500 | 600 | 400 | 600 | 500 | 400 | 500 | 600 | 400 | 600 | 500 | 400 | 500 | 600 | 400 | 500 |

| Device | Count | BIN 166 | BIN 168 | BIN 170 | BIN 171 | BIN 172 | BIN 173 | BIN 174 | BIN 175 | BIN 176 | BIN 183 | BIN 184 | BIN 203 | BIN 204 | BIN 208 | BIN 227 | BIN 229 |
|---|---|---|---|---|---|---|---|---|---|---|---|---|---|---|---|---|---|
| 1 | 38 | | | | | | | | 0 | | | | | | | | |
| 2 | 0 | | | | 0 | | | | | | | | | | | | |
| 3 | 10 | 1 | 1 | | 0 | 1 | 1 | | 1 | 1 | | | 1 | 1 | 1 | | |
| 4 | 2 | | | | | | | | | | 1 | 1 | | | | | |
| 5 | 0 | | | | | | | | | 1 | | | | | | | |
| 6 | 2 | | | 1 | | | 1 | | | | | | | | | | |
| 7 | 0 | | | | | | | 0 | | | | | | | | | |
| 8 | 3 | | | | | | | | | | | | | | | 1 | 1 |
| 9 | 3 | | | | | | | | | | | | | | | 1 | 1 |
| bin count | | 1 | 1 | 2 | 0 | 1 | 2 | 0 | 1 | 2 | 1 | 1 | 1 | 1 | 1 | 2 | 2 |
| test time (ms) | | 400 | 500 | 600 | 400 | 600 | 500 | 400 | 500 | 600 | 400 | 600 | 500 | 400 | 500 | 600 | 500 |

TEST TIME REDUCTION ALGORITHM

CROSS REFERENCE TO RELATED APPLICATION

This application claims the benefit under 35 USC 119(e) of Provisional Patent Application Ser. No. 60/790,444, filed Apr. 7, 2006, the disclosure thereof incorporated by reference herein in its entirety.

FIELD OF THE INVENTION

The present invention relates to testing electronic devices, including integrated circuit devices, and more particularly to a method and system for reducing test time for electronic devices.

BACKGROUND OF THE INVENTION

Integrated circuit manufacturers now deliver circuits containing tens of millions of gates. The ever-increasing complexity and speed of analog, digital and mixed-signal integrated circuits require appropriate and thorough test activities during development and production. Typically, a set of tests are performed sequentially on each device under test (DUT), and a test program measures target test specification values from the test responses obtained.

The test process is complicated, lengthy, and costly. One reason is that integrated circuits (ICs) are typically packaged before they are used with other components as part of a larger electronic system, and tests are performed on the IC at both the die stage and the packaged stage. Tests that focus on internal portions of the IC package are commonly referred to as "first-level" tests, while tests that focus on the reliability or function of the connection between the IC package and the printed wiring board are commonly referred to as "second-level" tests.

First-level tests may involve calibration test, continuity test, and leakage tests, for example. In addition, IC's are being designed as system-on-chip (SoC) devices having embedded blocks and structures, all of which require test and debug. Whenever memories are integrated into an IC, appropriate tests have to be conducted to make sure that the IC is not shipped with faulty memories. Thus, ICs are manufactured with built-in self test structures for testing embedded cores that provide test control at the chip level.

In addition, device specific tests are also run. For example, a multi-gigahertz radiofrequency (RF) circuit may undergo receive (RX) and transmit (TX) test for testing receive and transmit components, respectively, of the circuit.

Second-level tests generally involve variations in electronic signal bias, ambient temperature, ambient humidity, etc. Second-level tests generally subject the IC package to thermal cycling conditions while electronic signals are supplied to the IC package. The electronic signals are monitored for failure conditions, such as an unacceptable increase in electronic resistance at any given temperature (e.g. −25° C. to +85° C.), which may occur due to thermal expansion and/or contraction of any portion of the IC package.

For example, one well-known type of second-level test is an electronic bias test commonly known as a highly accelerated stress test (HAST). To perform a HAST, the packages must be placed into a separate device, called a stress socket, that makes an external electronic connection with the package. The stress sockets containing the packages are then attached to a board, and the board is then placed into a HAST chamber for electronic testing.

Depending on the type of device, before or after HAST testing, devices may be placed into another type of test apparatus for automated electronic testing Automated test equipment (ATE) comprises various instruments or cards used for testing memory, digital, mixed signal and system-on-chip (SOC) components, both at the wafer and packaged stages.

As can be seen, the sheer number of tests that may be performed on an electronic device may number in the hundreds. For example, for radiofrequency (RF) and multi-gigahertz devices, it is not uncommon for the devices to undergo 600 tests. Some of these tests are redundant, waste test time, and fail to improve quality. As a result, test costs continue to rise due to the cost of external test instrumentation as well as the time required to complete all of the tests.

Accordingly, it would be desirable to reduce the overall test time required to test electronic devices, such as ICs and IC/packages.

BRIEF SUMMARY OF THE INVENTION

Exemplary embodiments provide a method and system for reducing test time for electronic devices. The method and system aspects include receiving a test data file containing results from a set of tests run on a first set of devices; determining a frequency of failure metric for each of the tests from the test data file; classifying each one of the tests as redundant or necessary based on the frequency of failure metric determined for each of the tests; and creating a reduced set of tests that includes the necessary test but does not include the redundant tests.

Further embodiments provide a method and system aspects for (a) reading a test data file containing failure data for a set of devices tested by a set of tests; (b) using the failure data to total for each test, a first count of the number of devices that failed the test, and to total for each device, a second count of the number of tests each device failed; (c) using the second count totaled for each device to identify any test that uniquely detects a failure in that device, and classifying that test as a necessary test; (d) removing the failure data for any device that also failed the tests classified as necessary; (e) recalculating for each test, the first count of the number of devices that failed the test, and recalculating for each device, a second count of the number of tests each device failed; (f) selecting the test having the first count with a highest value, and classifying the test as a necessary test; (g) if at least two of the tests have respective first counts with the same highest value, then selecting the test having the lowest test time and classifying the test as a necessary test; (h) removing the failure data for any device that failed the tests classified as a necessary test in steps (f) and (g); (i) recalculating for each test, the first count of the number of devices that failed the test, and recalculating for each device, the second count of the number of tests each device failed; (g) repeating steps (f) through (i) until the failures of every device are zero and the first and second counts and counts become zero; and (h) outputting the tests classified as the necessary tests to produce a reduced set of tests.

According to the method and system disclosed herein, the exemplary embodiments identify and eliminate redundant tests, thereby effectively reducing the total number of tests required to accurately test a set of production devices. Consequently, the exemplary embodiments also reduce the overall time and cost necessary to perform testing on production devices.

DETAILED DESCRIPTION OF THE INVENTION

The present invention relates to reducing test time for electronic devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
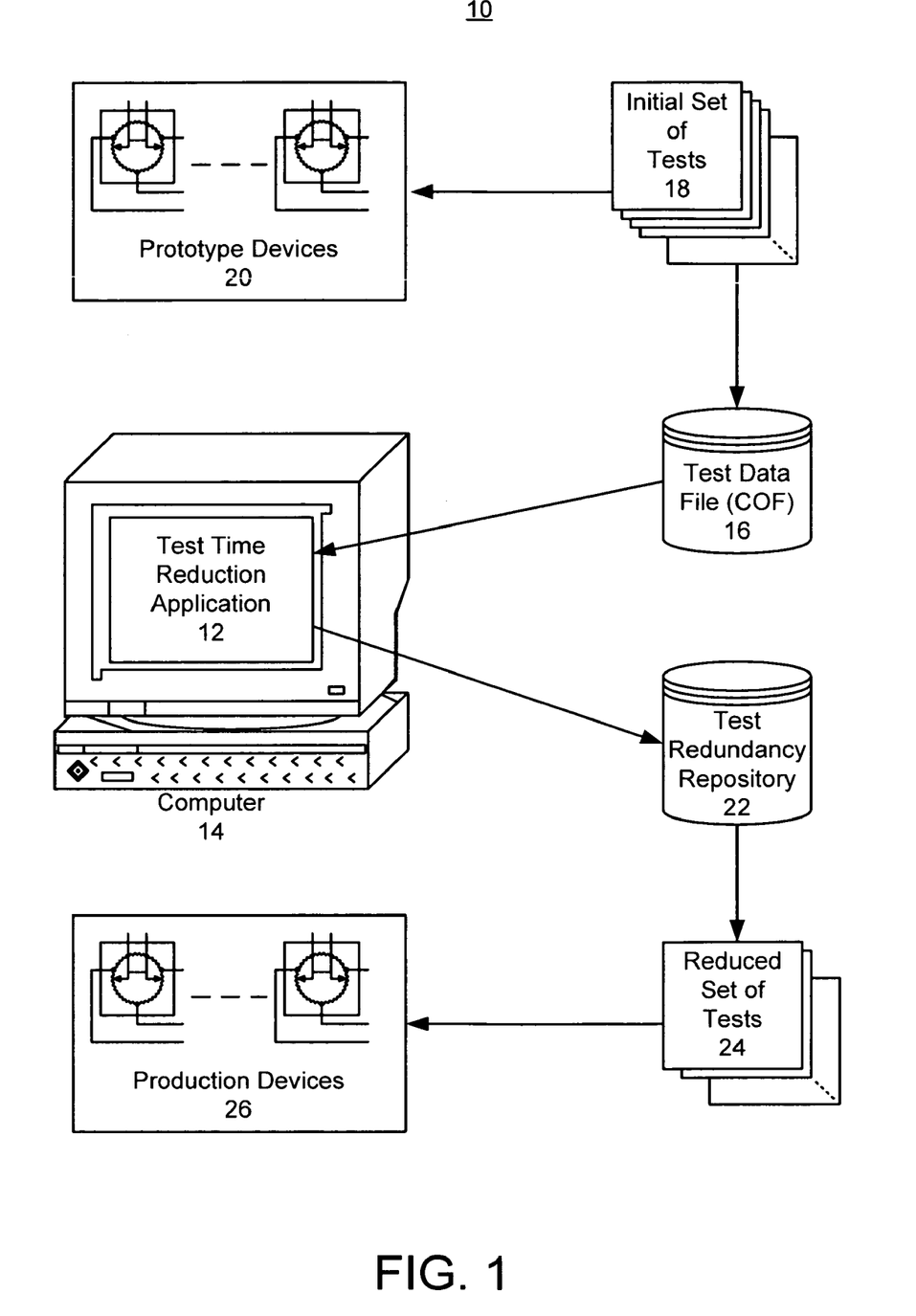
FIG. 1 is a block diagram illustrating a test redundancy detection system in accordance with an exemplary embodiment.

FIG. 1 is a block diagram illustrating a test redundancy detection system in accordance with an exemplary embodiment. The system 10 includes a test time reduction application 12 running on a computer 14, a test data file 16, an initial set of tests 18, a set of prototype devices 20, a test redundancy repository, a reduced set of tests 24, and a set of production devices 26.

In operation, the initial set of tests 18 may be performed on a set of test or prototype electronic devices 20, where the types of devices may include ICs and/or IC/packages, and the results of the tests are stored in the test data file 16. Once invoked, the test time reduction application 12 receives the test data file 16 containing the results of the initial set of tests 18, classifies the tests as redundant or necessary, and stores the results of the classification in the test redundancy repository 22. The test redundancy repository 22 is then used to generate the reduced set of tests 24 that does not contain the tests that have been classified as redundant. This reduced set of tests 24 may then be run on the same or another set of electronic devices, such as production devices 26. The test time reduction application 12 may be configured to run on any type of computer 14, including a personal computer (PC), a workstation, or a server, for example. The test time reduction application 12 determines which tests are redundant and which are necessary using a test redundancy algorithm, as described further below.

Figure 2:
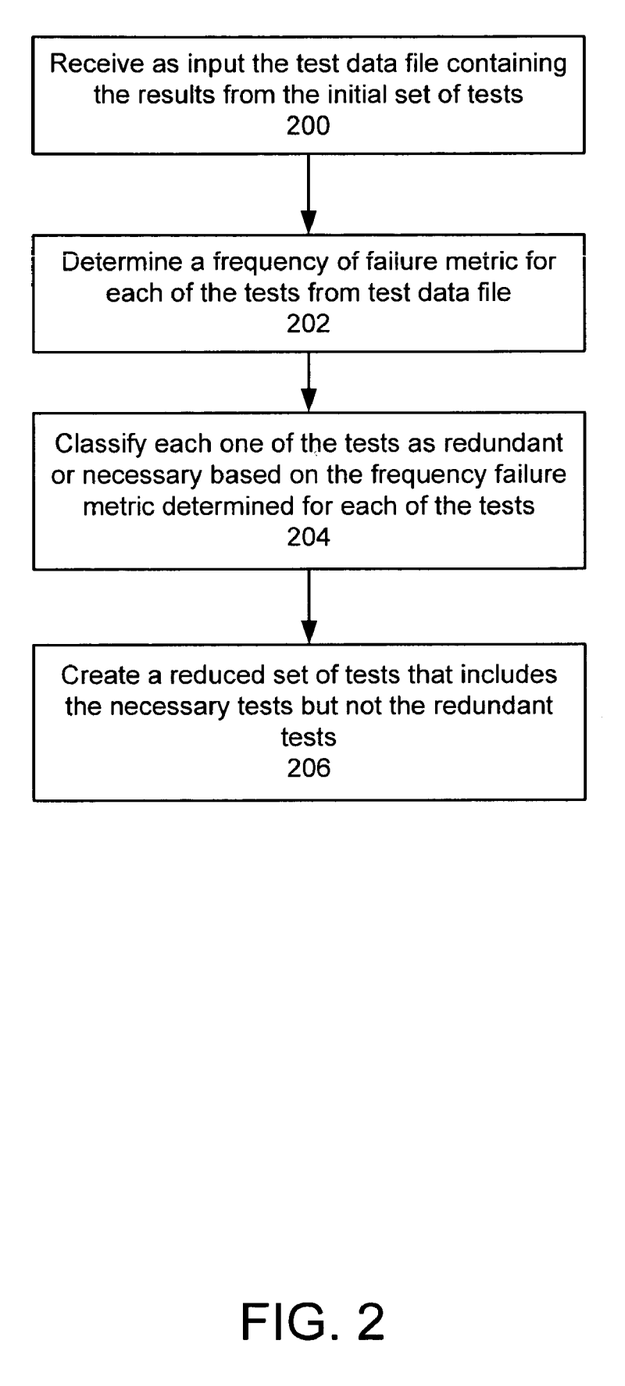
FIG. 2 is a flow diagram illustrating a process for reducing the time required to perform tests on an electronic device.

FIG. 2 is a flow diagram illustrating a process for reducing the time required to perform tests on an electronic device in accordance with an exemplary embodiment. The process begins in block 200 in which the test time reduction application 12 receives as input the test data file 16 containing the results from the initial set of tests 18 run on the devices 20. Preferably, the test data file 16 includes data for tests that were run in continue-on-fail (COF) mode, as opposed to tests run in stop-on-fail (SOF) mode. When a device 20 is run in COF mode, testing of the device 20 continues even though one or more faults may be detected in the device 20 during the tests. Conversely, when a device 20 is run in SOF mode, testing of the device 20 stops as soon as a fault is detected in the device 20 during any one of the tests. At a minimum, the contents of the test data file 16 include an indication of which devices 20 passed and/or failed which tests 18. Each of the tests 18 and tested devices 20 are preferably identified or named in the test data file 16 using any sequence of alphanumeric characters or graphics. The test data file 16 may also include the test times recorded for each test 18.

In block 202, the test time reduction application 12 determines a frequency of failure metric for each of the tests 18 from the test data file 16. In block 204, the test time reduction application 12 classifies each one of the tests 18 as redundant or necessary based on the frequency of failure metric determined for each of the tests 18. As used herein, a test may be considered a candidate for classification as a necessary test when that test is the only test in the set that detects a failure in a particular device. Such a test must be kept for accurate testing performance. A test may be considered a candidate for classification as a redundant test when more than one device fails the test. Such a test will be classified as redundant if it is determined that the test detects another failure in a device in which a failure was already detected by a necessary test.

In a preferred embodiment the results of the classification are stored as an identification of one or both of the redundant tests and the necessary tests in the test redundancy repository 22. The identification of the necessary and/or redundant tests may be stored as a list or as a table, and the test redundancy repository 22 may be implemented as a file, a folder, or a database.

In the exemplary embodiment, the test time reduction application 12 is run during a configuration phase in which the test data file 16 is compiled for prototype devices 20. After the redundant/necessary tests are identified in the test redundancy repository 22, in block 206, the test time reduction application 12 creates a reduced set of tests 24 that only includes the necessary tests but does not include the redundant tests. Therefore, the reduced set of tests 24 may include fewer number of tests than the initial set of tests 18. In a preferred embodiment, the reduced set of tests 24 is created using the test redundancy repository 22, and is used for subsequent testing. Preferably, the reduced set of tests 24 is run on production devices 26 during a production phase.

According to the exemplary embodiment disclosed herein, because the test time reduction application 12 identifies and eliminates redundant tests from the initial set of tests 18, the total number of tests required to accurately test the production devices 26 is effectively reduced, thereby reducing the overall time and cost of the testing process.

Figure 3A:
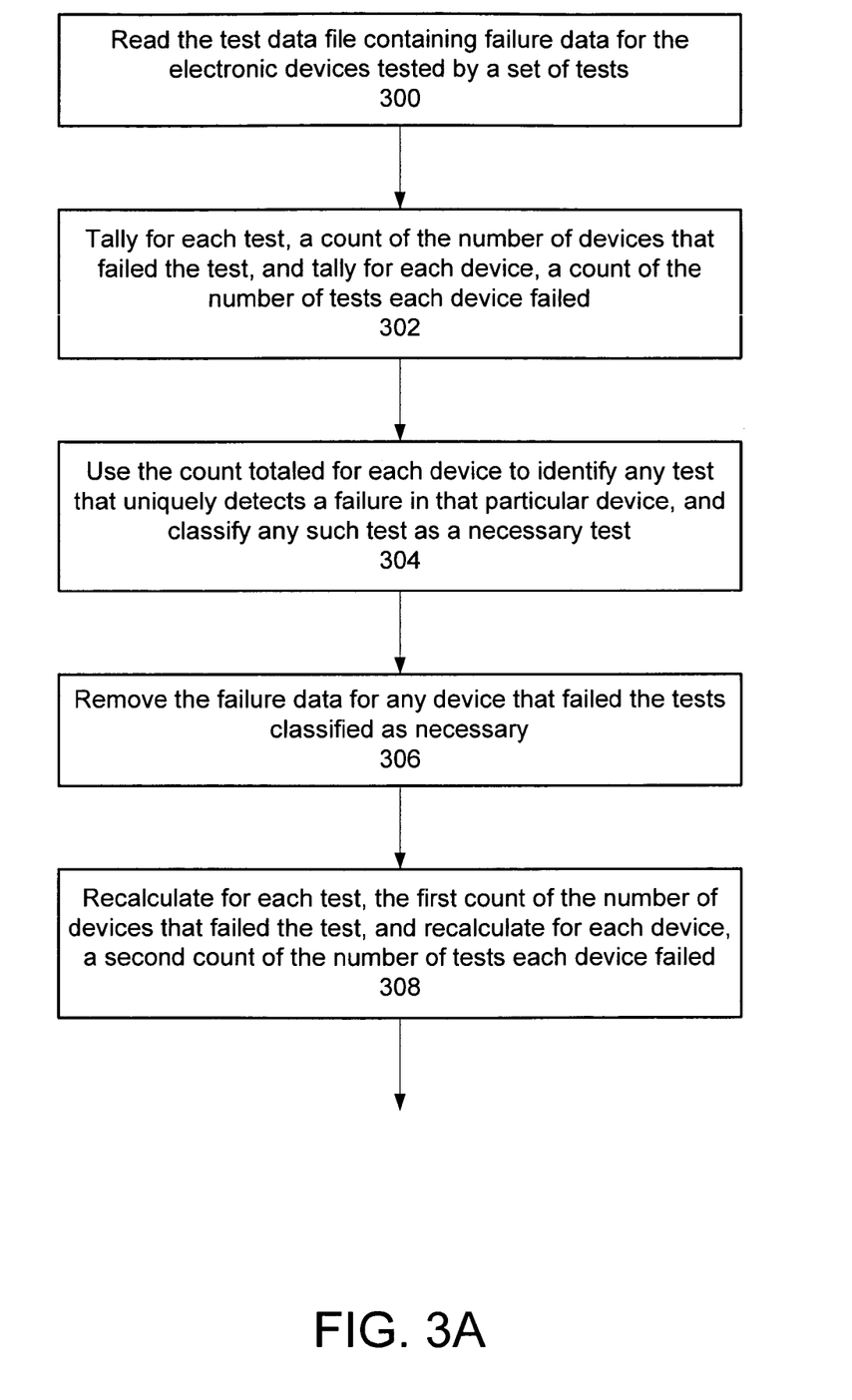
FIGS. 3A and 3B are flow diagrams illustrating the process performed by the test time reduction application for identifying redundant tests.
Figure 3B:
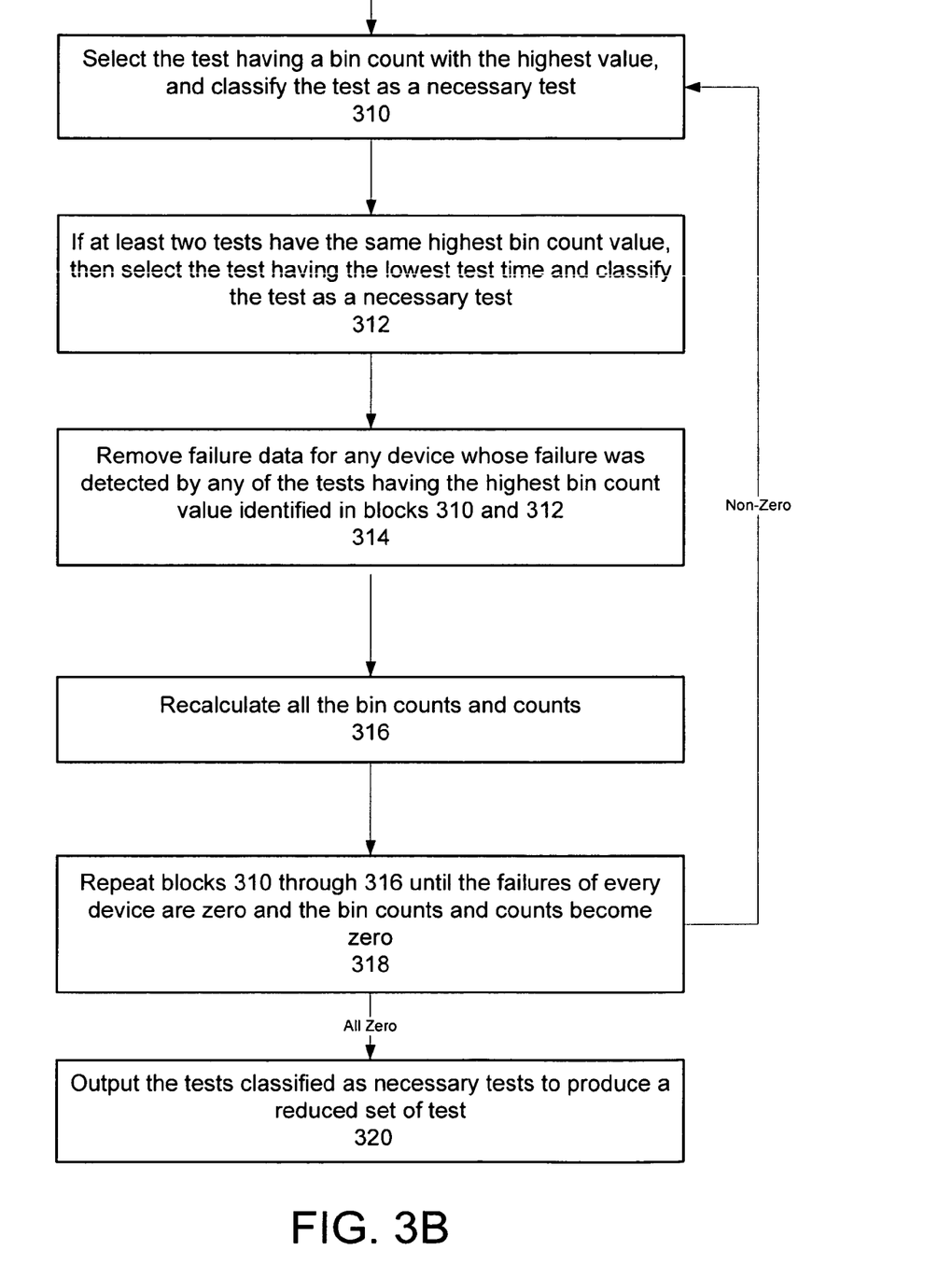

FIGS. 3A and 3B are flow diagrams illustrating the process performed by the test time reduction application 12 for identifying redundant tests. The process begins in block 300 in which the test time reduction application 12 reads the test data file 16 containing failure data for the electronic devices 20 tested by the initial set of tests 18. In step 302, the test time reduction application 12 uses the failure data to tally for each test, a count of the number of devices 20 that failed the test, and to tally for each device 20, a count of the number of tests 18 each device 20 failed. These counts are included as part of the failure metric.

Figure 4A:
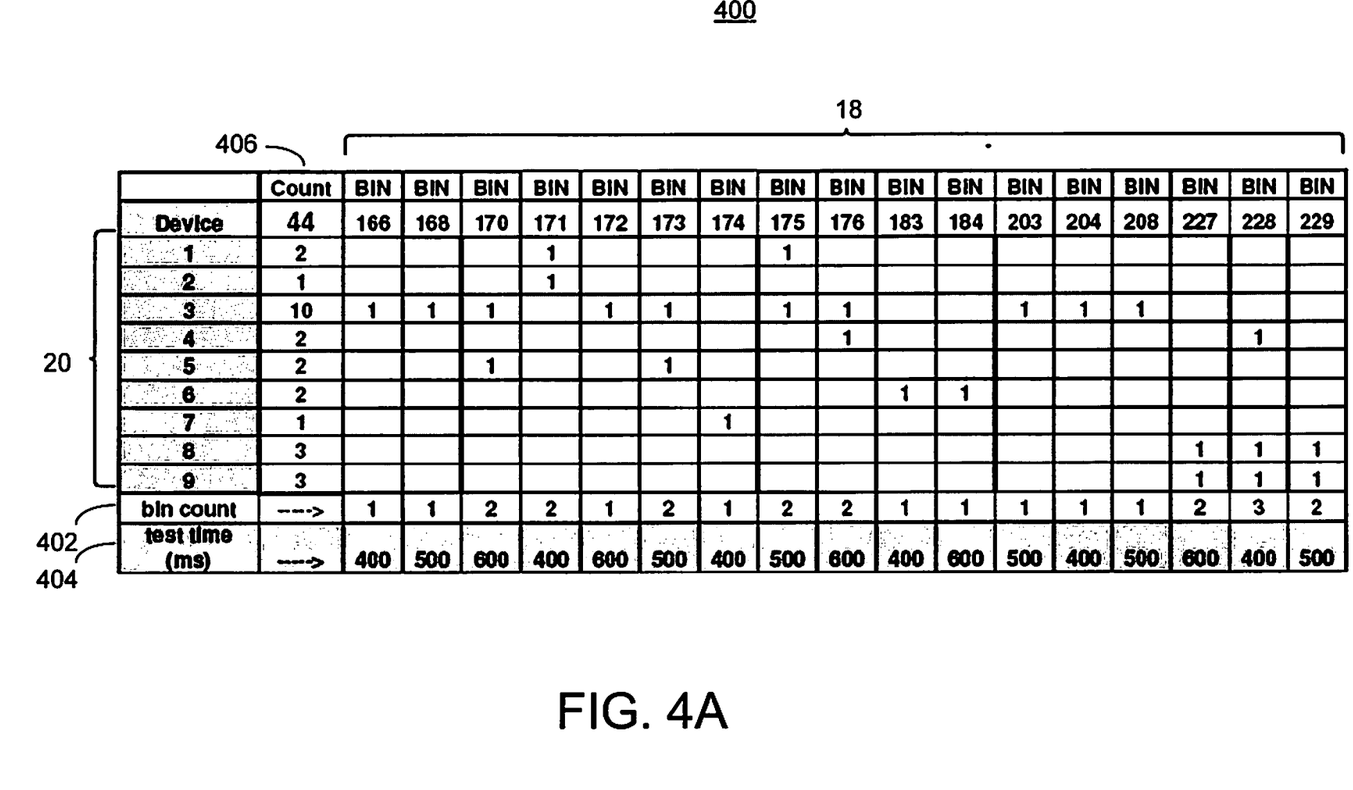
FIGS. 4A through 4E are diagrams of exemplary representations in table format of the processing of failure data for classifying tests as necessary or redundant in accordance with the exemplary embodiments.

FIG. 4A is a diagram illustrating an exemplary representation in table format of a tabulation of failure data resulting from the testing of the set of devices 20 with the initial set of tests 18. The table 400 includes a column for each one of the tests 18, and a row or record for each one of the tested devices 20. In this example, there are 17 tests, each of which is identified by a BIN number, e.g., 166, 168, 170, and so on. There are nine devices 20 that are also identified by numbers, e.g. 1, 2, 3, and so on. Failure data is provided by a value, e.g., "1", at a row and column intersection to indicate that the device 20 in the corresponding row failed the test 18 in the corresponding column.

The total number of failing devices 20 for each test 18 can be determined by summing the values in each column. This total for each test 18 is referred to as a bin count 402. The bin counts 402 for all the tests are listed in a row along with a row listing each test's test time 404 at the bottom of the table 400. In this example, test 171 detected failures in devices "1" and "2", for instance. Therefore, the bin count 402 for test "171" is "2".

The total number of tests 18 that each device 20 failed can be determined by summing the values in each row. The total for each device 20 is simply referred to as a count 406. The counts 406 for all the devices 20 are listed in a column next to the column of device numbers. In this example, device 1 failed tests "171" and "175", and therefore has a count of "2", for instance.

Referring again to FIG. 3A, after calculating the bin counts 402 and the counts 406, in block 304 the test time reduction application 12 uses the counts 406 totaled for each device 20 to identify any test 18 that uniquely detects a failure in that particular device 20. This process is referred to as simple reduction.

Figure 4B:
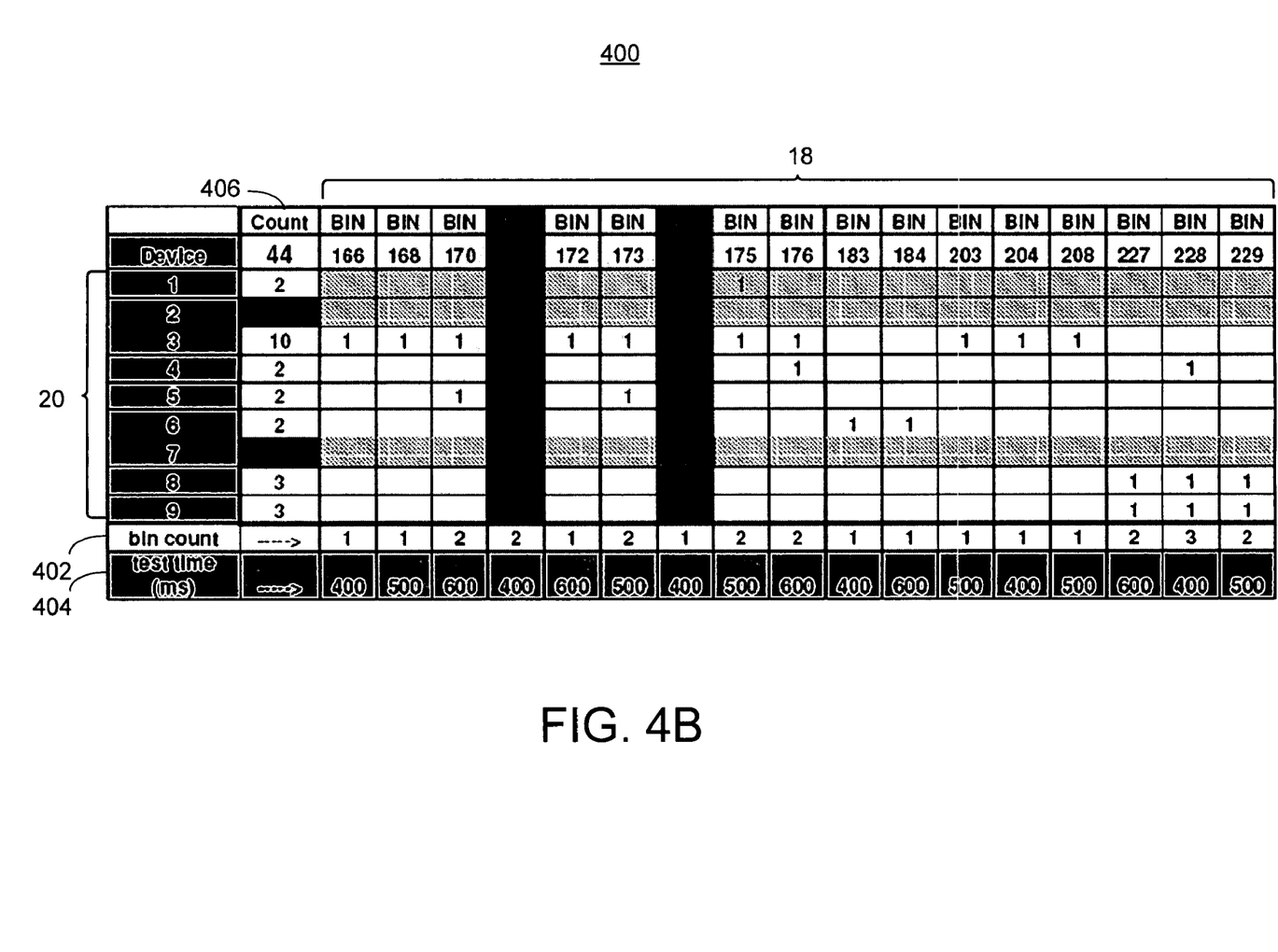

FIG. 4B is a diagram illustrating processing of the exemplary table 400 during simple reduction. Simple reduction can be performed by finding the devices 20 having a count 406 value of "1" and then labeling the corresponding test that the device 20 failed as necessary. In the example shown, device "2" is the only device that failed test "171" and, device "7" is the only device that failed test "174". Therefore, tests "171" and "174" are necessary and kept.

Referring again to FIG. 3A, after identifying the necessary tests 18, the test time reduction application 12 in block 306 removes the failure data for any device 20 that failed the tests classified as necessary. In other words, once a test 18 detects a failure in one device, detecting another failure in the same device is redundant, so the redundant data is removed (i.e., zeroed or blanked). In block 308, the test time reduction application 12 recalculates all the bin counts 402 and the counts 406.

Figure 4C:
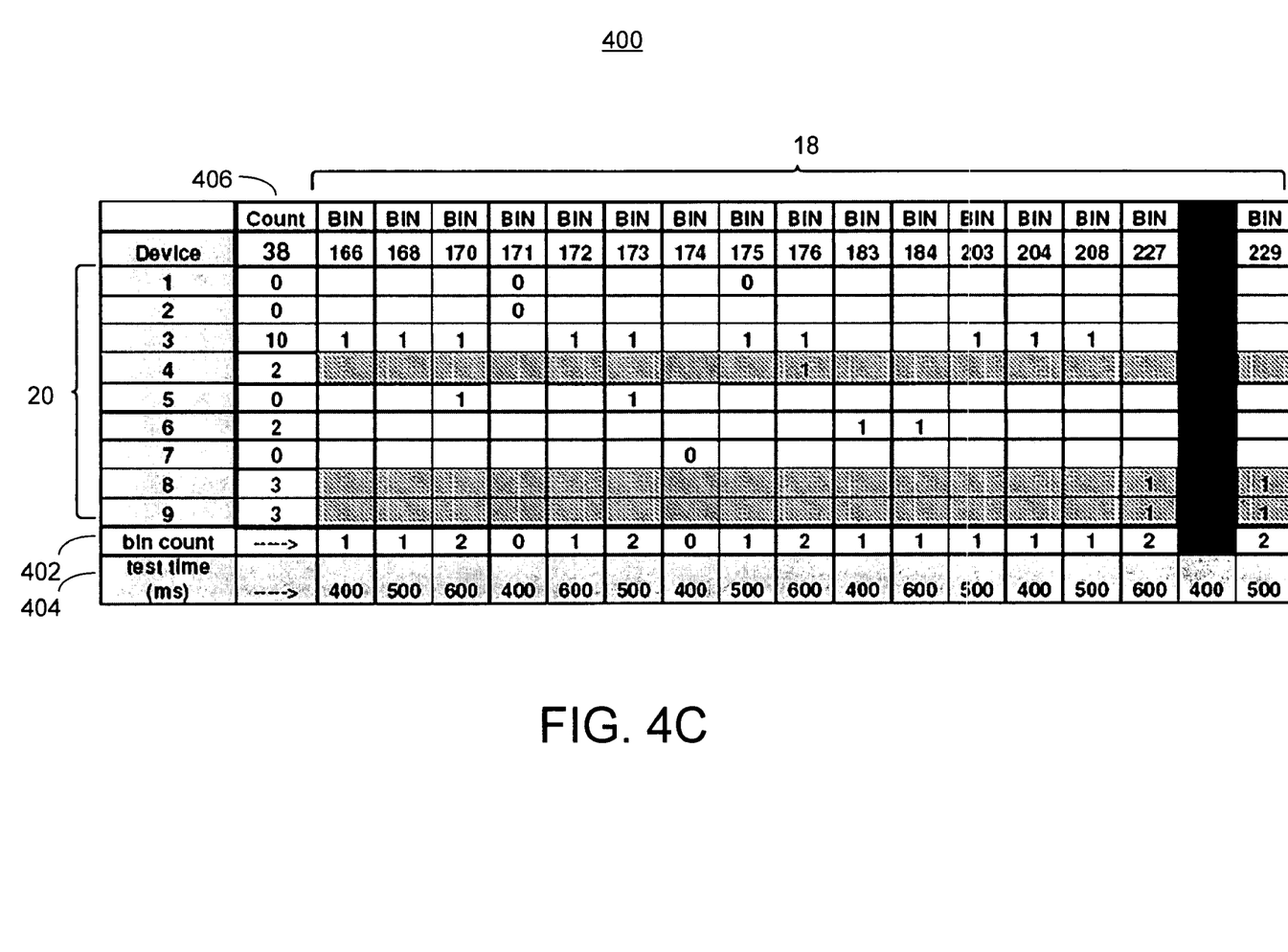

Referring to FIG. 4C, for example, tests "171" and "174" are classified as necessary. Accordingly, the failure data for devices "2" and "7" that uniquely failed these two tests are zeroed out, as shown. Device "1", however, also failed test "171" in addition to device "2". Accordingly, the failure data for device "1", i.e., the row for device "1" is also zeroed out. As shown, the bin counts 402 and counts 406 have also been recalculated.

Referring now to FIG. 3B, in block 310, the test 18 having a bin count with the highest value is selected and classified as a necessary test. If at least two tests 18 have the same highest bin counts values (a tie), then in block 312, the test time reduction application 12 selects the test having the lowest test time 404. As shown in FIG. 4C, at this stage, test "228" has a bin count 402 value of "3", which is the highest of all the bin count 402 values. The highest bin count value is not shared with any other tests 18, so the tie-break step is not necessary at this stage. In another embodiment, other test properties may be used to break ties, such as the complexity of the test e.g., using more or less resources, for instance.

In block 314, the test time reduction application 12 removes failure data for any device 20 whose failure was detected by any of the tests having the highest bin count value identified in blocks 310 and 312. Continuing with the example shown in FIG. 4C, failures of devices "4", "8", and "9" (all shown shaded) are detected by test 228. Therefore, the failure data in the rows corresponding to devices "4", "8", and "9" will be zeroed.

In block 316, the test time reduction application 12 recalculates all the bin counts 402 and counts 406. In block 318, the tests time reduction application 12 repeats blocks 310 through 316 until the failures of every device 18 are zero and the bin counts 402 and counts 406 become zero.

Figure 4D:
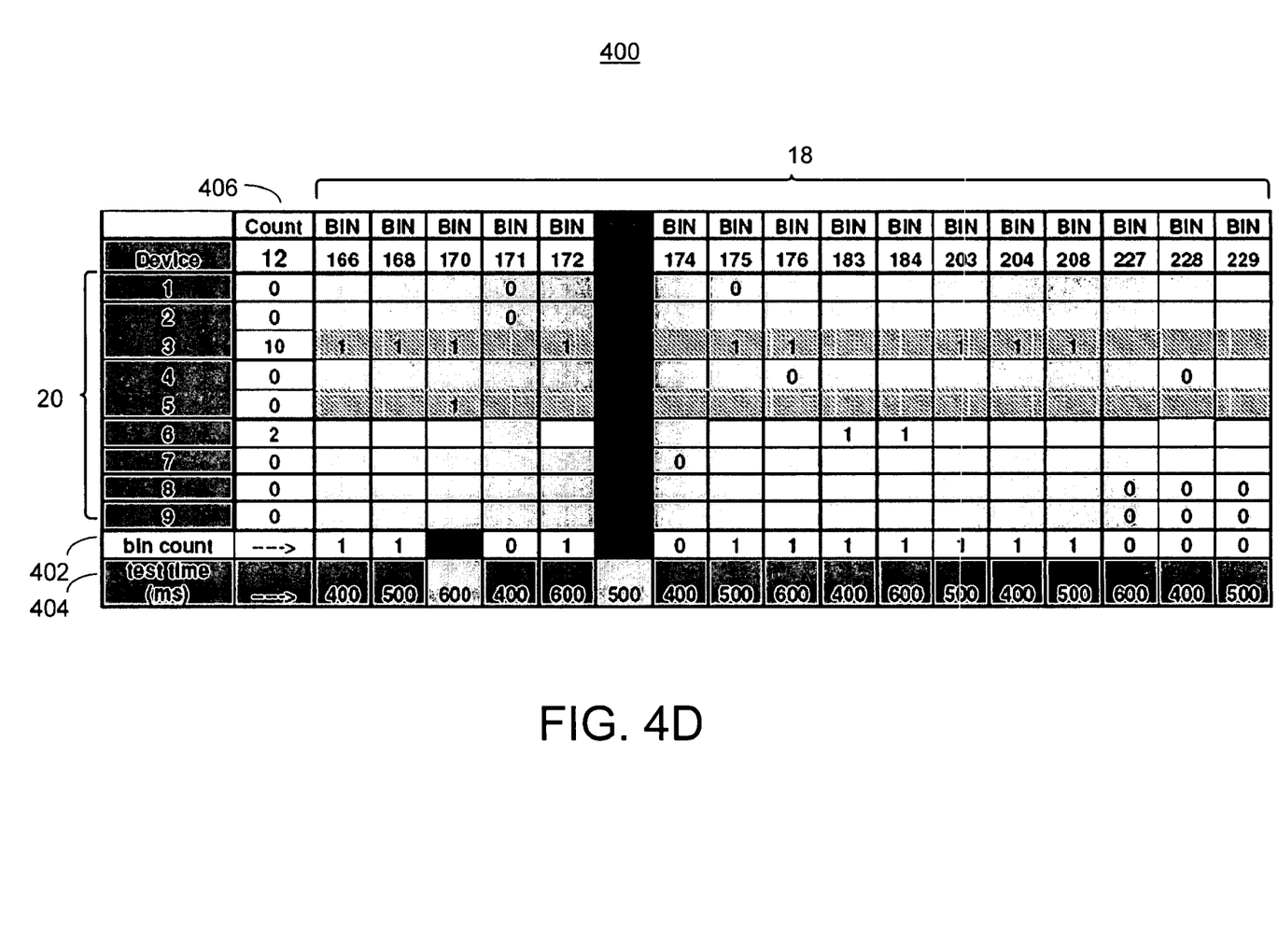

FIG. 4D shows the state of the table 400 during a subsequent iteration of blocks 310 through 316 after the failure data in the rows corresponding to devices "4", "8", and "9" are zeroed. The table 400 shows that a tie exists between tests "170" and "173" for having the highest bin count 402 value (2). In this case, the tie is broken by selecting the test having the lowest test time 404. In this case test "173" has a lower test time (500 ms) and is classified as necessary instead of test "170" (600 ms). The failure data for devices "3" and "5" whose failure was detected by test "173" are then zeroed out.

Figure 4E:
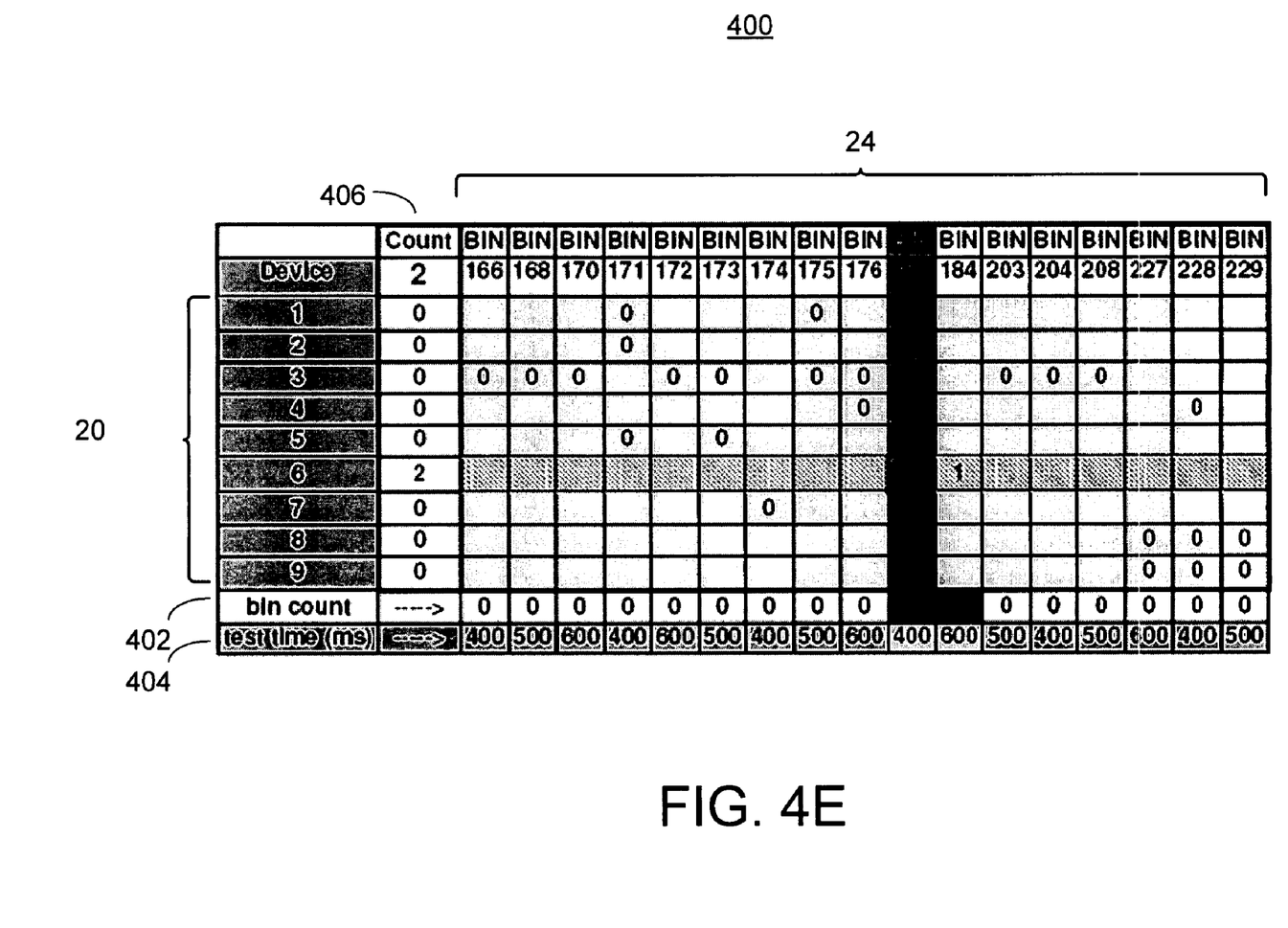

FIG. 4E continues with the example showing that after failure data for devices "3" and "5" whose failures were detected by test "173" are zeroed, a tie exists between tests "183" and "184" for having the highest bin count 402 value (1). In this case, test "183" has a lower test time (400 ms) and is classified as necessary instead of test "184" (600 ms). The failure data for device "6" whose failures were detected by test "183" is zeroed out, and the bin counts 402 and counts 406 are recalculated. After this step, the bin counts 402 and counts 406 are all zero.

Referring again to FIG. 3B, once the failures of every device 18, and the bin counts 402 and counts 406 are zero, the test redundancy process is complete and in block 320, the test time redundancy application 12 outputs the tests classified as necessary tests to produce the reduced set of tests 24. In the example above, the test time redundancy application 12 classified as necessary tests 171, 174, 228, 173, and 183. A list of these tests may be stored in the test redundancy repository 22, and the list is then used to form the reduced set of tests 24. Rather than 17 tests included in the initial set of tests 18, the reduced set of tests 24 in this example would only include five tests, the other 12 being redundant.

Accordingly, by classifying tests 18 as necessary and redundant, the test time reduction application 12 reduces an initial set of tests 18 to a reduced set of only necessary tests 24, thereby saving test time and costs.

A method and system for reducing test time for electronic devices has been disclosed. The present invention has been described in accordance with the embodiments shown, and one of ordinary skill in the art will readily recognize that there could be variations to the embodiments, and any variations would be within the spirit and scope of the present invention. For example, the present invention can be implemented using hardware, software, a computer readable medium containing program instructions, or a combination thereof. Software written according to the present invention is to be either stored in some form of computer-readable medium such as memory or CD-ROM, or is to be transmitted over a network, and is to be executed by a processor. Accordingly, many modifications may be made by one of ordinary skill in the art without departing from the spirit and scope of the appended claims.

I claim:

1. A computer-implemented method for reducing test time for electronic devices, the method comprising:

receiving a test data file containing results from N tests run on M devices, where N and M are integers greater than 1;

determining a failure metric for each of the N tests from the test data file;

classifying each of the N tests as redundant tests or necessary tests based on the failure metric determined for each of the N tests; and creating a reduced set of tests that includes the necessary tests but does not include the redundant tests, wherein the failure metric for each of the N tests comprises a first count of a number of the M devices that failed each of the N tests, and for each of the M devices, a second count of a number of the N tests each of the M devices failed.

2. The method of claim 1, further comprising using the reduced set of tests for subsequent testing of X devices, where X is an integer.

3. The method of claim 2, wherein the M devices includes a set of prototype devices, and the X devices includes a set of production devices.

4. The method of claim 1, wherein the failure metric further includes a test time for each of the N tests.

5. The method of claim 1, wherein classifying each of the N tests further comprises considering a test a candidate for classification as a redundant test when the test detects another failure in a device in which a failure was already detected by one of the necessary tests.

6. The method of claim 5, wherein classifying each of the N tests further comprises using the second count totaled for each of the M devices to identify a test that uniquely detects a failure in a device, and classifying the test as a necessary test.

7. The method of claim 6, wherein classifying each of the N tests further comprises:

removing test results for a device that failed the ones of the N tests that are classified as necessary; and recalculating for each of the N tests, the first count of the number of M devices that failed each of the N tests, and recalculating for each of the M devices, the second count of the number of the N tests each of the M devices failed.

8. The method of claim 7, further comprising:

(i) selecting a test having the first count with a highest value, and classifying the test as a necessary test;

(ii) if at least two of the N tests have respective first counts with the same highest value, then selecting the test having the lowest test time and classifying the test as a necessary test;

(iii) removing failure data for a device that failed the tests classified as necessary tests in steps (i) and (ii);

(iv) recalculating for each of the N tests, the first count of the number of the M devices that failed each of the N tests, and recalculating for each of the M devices, the second count of the number of the N tests each of the M devices failed; and (v) repeating steps (i) through (v) until the failures of every one of the M devices are zero and the first and second counts become zero.

9. The method of claim 8, further comprising:

(vi) outputting the necessary tests to produce the reduced set of tests.

10. The method of claim 1, further comprising storing an identification of at least one of the redundant tests and the necessary tests in a test redundancy repository.

11. The method of claim 1, further comprising running the N tests on the M devices to compile the test data file during a configuration phase, and using the reduced set of tests during a production phase on X devices including production devices, where X is an integer.

12. The method of claim 1, further comprising storing in the test data file data for tests that were run in a continue-on-fail mode.

13. A computer-readable medium that stores a program for reducing test time of electronic devices, the program comprising instructions for:

receiving a test data file containing results from N tests run on the M devices, where N and M are integers greater than 1;

determining a failure metric for each of the N tests from the test data file;

classifying each of the N tests as redundant or necessary based on the failure metric determined for each of the N tests; and creating a reduced set of tests that includes the necessary tests but does not include the redundant tests, wherein the failure metric for each of the N tests comprises a first count of a number of the M devices that failed each of the N tests, and for each of the M devices, a second count of a number of the N tests each of the M devices failed.

14. The computer-readable medium of claim 13, wherein the program further comprises instructions for using the reduced set of tests for subsequent testing X devices, where X is an integer.

15. The computer-readable medium of claim 14, wherein the M devices include a set of production devices and the X devices include a set of production devices.

16. The computer-readable medium of claim 13, wherein the failure metric further includes a test time for each test.

17. The computer-readable medium of claim 13, wherein the instructions for classifying each of the N tests further comprises instructions for considering a test a candidate for classification as a redundant test when the test detects another failure in a device in which a failure was already detected by one of the necessary tests.

18. The computer-readable medium of claim 17, wherein the instructions for classifying each of the N tests further comprises instructions for using the second count totaled for each of the M devices to identify a test that uniquely detects a failure in that device, and classifying that test as a necessary test.

19. The computer-readable medium of claim 18, wherein the instructions for classifying each of the N tests further comprises instructions for:

removing test results for a device that failed the tests classified as necessary; and recalculating for each test, the first count of the number of the M devices that failed the test, and recalculating for each of the M devices, the second count of the number of the N tests each of the M devices failed.

20. The computer-readable medium of claim 19, wherein the program further comprises instructions for:

(i) selecting a test having the first count with a highest value, and classifying the test as a necessary test;

(ii) if at least two of the N tests have respective first counts with the same highest value, then selecting the test having the lowest test time and classifying the test as a necessary test;

(iii) removing failure data for a device that failed the tests classified as necessary tests in steps (i) and (ii);

(iv) recalculating for each of the N tests, the first count of the number of the M devices that failed the test, and recalculating for each of the M devices, the second count of the number of the N tests each of the M devices failed; and (v) repeating steps (i) through (v) until the failures of every one of the M devices are zero and the first and second counts become zero.

21. The computer-readable medium of claim 20, wherein the program further comprises instructions for:
(vi) outputting the necessary tests to produce the reduced set of tests.

22. The computer-readable medium of claim 13, wherein the program further comprises instructions for storing an identification of at least one of the redundant tests and the necessary tests in a test redundancy repository.

23. The computer-readable medium of claim 13, wherein the program further comprises instructions for running the N tests on the M devices to compile the test data file during a configuration phase, and using the reduced set of tests during a production phase on X devices including production devices, where X is an integer.

24. The computer-readable medium of claim 13, wherein the program further comprises instructions for storing in the test data file data for the N tests that were run in a continue-on-fail mode.

25. A test redundancy system, comprising:
M devices, where M is an integer greater than 1;
a test data file for storing results of N tests, where N is an integer greater than 1; and
a test time reduction application running on a computer, the test time reduction application configured to:
 receive the test data file;
 determine a failure metric for each of the N tests from the test data file;
 classify each one of the N tests as redundant or necessary on the failure metric determined for each of the N tests; and
 create a reduced set of tests that includes the necessary test but does not include the redundant tests,
wherein the failure metric for each of the N tests comprises a first count of a number of the M devices that failed each of the N tests, and for each of the M devices, a second count of a number of the N tests each of the M devices failed.

26. The test redundancy system of claim 25, wherein the reduced set of tests is used for subsequent testing of X devices, where X is an integer.

27. The test redundancy system of claim 26, wherein the M devices include a set of prototype devices and the X devices include a set of production devices.

28. The test redundancy system of claim 25, wherein the failure metric further includes a test time for each test.

29. The test redundancy system of claim 25, wherein the N tests are classified by considering a test a candidate for classification as a redundant test when the test detects another failure in a device in which a failure was already detected by one of the necessary tests.

30. The test redundancy system of claim 29, wherein the N tests are classified by using the second count totaled for each of the M devices to identify a test that uniquely detects a failure in that device, and classifying that test as a necessary test.

31. The test redundancy system of claim 30, wherein the N tests are further classified by:
removing test results for a device that failed the tests classified as necessary; and
recalculating for each of the N tests, the first count of the number of the M devices that failed each of the N tests, and recalculating for each of the M devices, the second count of the number of the N tests each of the M devices failed.

32. The test redundancy system of claim 31, wherein the N tests are further classified by:
(i) selecting a test having the first count with a highest value, and classifying the test as a necessary test;
(ii) if at least two of the N tests have respective first counts with the same highest value, then selecting the test having the lowest test time and classifying the test as a necessary test;
(iii) removing failure data for a device that failed the tests classified as a necessary test in steps (i) and (ii);
(iv) recalculating for each of the N tests, the first count of the number of the M devices that failed the test, and recalculate for each of the M devices, the second count of the number of the N tests each of the M devices failed; and
(v) repeating blocks (i) through (v) until the failures of every one of the N devices are zero and the first and second counts become zero.

33. The test redundancy system of claim 32, wherein the N tests are further classified by:
(vi) outputting the necessary tests to produce the reduced set of tests.

34. The test redundancy system of claim 25, wherein an identification of at least one of the redundant tests and the necessary tests is stored in a test redundancy repository.

35. The test redundancy system of claim 25, wherein the N tests are run on the M devices to compile the test data file during a configuration phase, and the reduced set of tests are used during a production phase on production devices.

36. The test redundancy system of claim 25, further comprising storing in the test data file data for the N tests that were run in a continue-on-fail mode.

37. A test redundancy system, comprising:
means for receiving the test data file containing results from N tests run on a M devices, where N and M are integers greater than 1;
means for determining a failure metric for each of the N tests from the test data file;
means for classifying each one of the N tests as redundant or necessary based on a failure metric determined for each of the N tests; and
means for creating a reduced set of tests that includes the necessary tests but does not include the redundant tests,
wherein the failure metric for each of the N tests comprises a first count of a number of the M devices that failed each of the N tests, and for each of the M devices, a second count of a number of the N tests each of the M devices failed.

38. A computer-implemented method for reducing test time for electronic devices, the method comprising:
(a) reading a test data file containing failure data for M devices tested by N tests, where M and N are integers greater than 1;
(b) using the failure data to total for each of the N tests, a first count of the number of devices that failed the test, and to total for each of the M devices, a second count of the number of the N tests each of the M devices failed;
(c) using the second count totaled for each of the M devices to identify a test that uniquely detects a failure in that device, and classifying that test as a necessary test;
(d) removing the failure data for a device that also failed the tests classified as necessary;
(e) recalculating for each of the N tests, the first count of the number of the M devices that failed the test, and recalculating for each of the M devices, a second count of the number of the N tests each of the M devices failed;

(f) selecting the test having the first count with a highest value, and classifying the test as a necessary test;

(g) if at least two of the N tests have respective first counts with the same highest value, then selecting the test having the lowest test time and classifying the test as a necessary test;

(h) removing the failure data for a device that failed the tests classified as a necessary test in steps (f) and (g);

(i) recalculating for each of the N tests, the first count of the number of the M devices that failed the test, and recalculating for each of the M devices, the second count of the number of the N tests each of the M devices failed;

(j) repeating steps (f) through (i) until the failures of every device are zero and the first and second counts become zero; and (k) outputting the necessary tests to produce a reduced set of tests.

39. A computer-readable medium comprising a program for reducing test time of electronic devices, the program comprising instructions for:

(a) reading a test data file containing failure data for M devices tested by a set of N tests, where M and N are integers greater than 1;

(b) using the failure data to total for each of the N tests, a first count of the number of the M devices that failed the test, and to total for each of the M devices, a second count of the number of the N tests each of the M devices failed;

(c) using the second count totaled for each of the M devices to identify a test that uniquely detects a failure in that device, and classifying that test as a necessary test;

(d) removing the failure data for a device that also failed the tests classified as necessary;

(e) recalculating for each of the N tests, the first count of the number of the M devices that failed the test, and recalculating for each of the M devices, a second count of the number of the N tests each of the M devices failed;

(f) selecting a test having the first count with a highest value, and classifying the test as a necessary test;

(g) if at least two of the N tests have respective first counts with the same highest value, then selecting a test having the lowest test time and classifying the test as a necessary test;

(h) removing the failure data for a device that failed the tests classified as a necessary tests in steps (f) and (g);

(i) recalculating for each of the N tests, the first count of the number of the M devices that failed the test, and recalculating for each of the M devices, the second count of the number of the N tests each of the M devices failed;

(j) repeating steps (f) through (i) until the failures of every one of the M devices are zero and the first and second counts become zero; and (k) outputting the necessary tests to produce a reduced set of tests.

* * * * *